United States Patent
Park et al.

(10) Patent No.: US 11,560,067 B2
(45) Date of Patent: Jan. 24, 2023

(54) APPARATUS AND METHOD FOR PROCESSING BATTERY CELL VOLTAGE DATA

(71) Applicant: LG Chem, Ltd., Seoul (KR)

(72) Inventors: Jun Cheol Park, Daejeon (KR); Keunwook Lee, Daejeon (KR)

(73) Assignee: LG Energy Solution, Ltd.

( * ) Notice: Subject to any disclaimer, the term of this patent is extended or adjusted under 35 U.S.C. 154(b) by 466 days.

(21) Appl. No.: 16/333,429

(22) PCT Filed: Nov. 28, 2017

(86) PCT No.: PCT/KR2017/013668
§ 371 (c)(1),
(2) Date: Mar. 14, 2019

(87) PCT Pub. No.: WO2018/164346
PCT Pub. Date: Sep. 13, 2018

(65) Prior Publication Data
US 2019/0257889 A1     Aug. 22, 2019

(30) Foreign Application Priority Data

Mar. 6, 2017 (KR) .................. 10-2017-0028250

(51) Int. Cl.
*G01R 31/385* (2019.01)
*B60L 58/12* (2019.01)
(Continued)

(52) U.S. Cl.
CPC ............... *B60L 58/12* (2019.02); *B60L 50/64* (2019.02); *B60L 58/16* (2019.02); *G01R 31/36* (2013.01);
(Continued)

(58) Field of Classification Search
CPC .......... B60L 58/12; B60L 58/16; B60L 58/10; B60L 50/64; B60L 2240/547;
(Continued)

(56) References Cited

U.S. PATENT DOCUMENTS 6,359,419 B1    3/2002  Verbrugge et al.
6,400,123 B1 *  6/2002  Bean .................. G01R 31/3648
                                                320/132
(Continued)

FOREIGN PATENT DOCUMENTS

CN    1760691 A    4/2006
CN  102355015 A    2/2012
(Continued)

OTHER PUBLICATIONS

Extended European Search Report including Written Opinion for Application No. EP17899307.7, dated Jun. 24, 2019, pp. 1-9.
(Continued)

*Primary Examiner* — Richard Isla
*Assistant Examiner* — Johali A Torres Ruiz
(74) *Attorney, Agent, or Firm* — Lerner, David, Littenberg, Krumholz & Mentlik, LLP

(57) ABSTRACT

An apparatus and a method for processing battery cell voltage data, which calculate a moving average by assigning a weight to one or more voltage data acquired from the battery cell and reflect the acquired voltage data to the calculated moving average and use the voltage data to rapidly follow a sudden change of the voltage data applied from the battery cell.

16 Claims, 2 Drawing Sheets

(51) Int. Cl.
  *G01R 31/3835* (2019.01)
  *G01R 31/3842* (2019.01)
  *B60L 58/16* (2019.01)
  *G01R 31/392* (2019.01)
  *G01R 31/36* (2020.01)
  *B60L 50/64* (2019.01)
(52) U.S. Cl.
  CPC ....... *G01R 31/385* (2019.01); *G01R 31/3835* (2019.01); *G01R 31/3842* (2019.01); *G01R 31/392* (2019.01); *Y02T 10/70* (2013.01)
(58) Field of Classification Search
  CPC .. G01R 31/3842; G01R 31/36; G01R 31/392; G01R 31/385; G01R 31/3835; G01R 31/396; G01R 31/3648; G01R 19/003; H02J 2007/0067; H02J 7/0063; Y02T 10/70
  See application file for complete search history.

(56) References Cited

U.S. PATENT DOCUMENTS

| | | | |
|---|---|---|---|
| 6,472,875 | B1 | 10/2002 | Meyer |
| 8,639,460 | B2 | 1/2014 | Kang et al. |
| 2003/0076109 | A1* | 4/2003 | Verbrugge ......... G01R 31/3835 324/427 |
| 2003/0101027 | A1 | 5/2003 | Weber et al. |
| 2005/0154544 | A1* | 7/2005 | Ono ................... G01R 31/3828 702/63 |
| 2006/0076929 | A1 | 4/2006 | Tatsumi et al. |
| 2006/0197536 | A1* | 9/2006 | Gandhi ............... A61N 1/3708 324/426 |
| 2009/0282186 | A1* | 11/2009 | Mokhlesi ........... G11C 16/0483 711/E12.001 |
| 2010/0174499 | A1* | 7/2010 | Kang .................. G01R 31/367 702/63 |
| 2012/0259568 | A1* | 10/2012 | Chang ................ G01R 31/3835 702/63 |
| 2013/0080096 | A1* | 3/2013 | Toki .................... G01R 31/389 702/63 |
| 2013/0127415 | A1* | 5/2013 | Ohtomo ............ H02J 7/007182 320/109 |
| 2014/0052396 | A1* | 2/2014 | Jin ...................... G01R 31/392 702/63 |
| 2016/0061902 | A1 | 3/2016 | Jeong et al. |
| 2016/0061908 | A1 | 3/2016 | Torai et al. |

FOREIGN PATENT DOCUMENTS

| | | | |
|---|---|---|---|
| CN | 102739845 | A | 10/2012 |
| CN | 103105585 | A | 5/2013 |
| CN | 105375044 | A | 3/2016 |
| CN | 105388422 | A | 3/2016 |
| JP | 05-265072 | A | 10/1993 |
| JP | 2003535417 | A | 11/2003 |
| JP | 2015198276 | A | 11/2015 |
| JP | 201677207 | A | 5/2016 |
| KR | 20090020470 | A | 2/2009 |
| KR | 2010084935 | A * | 7/2010 |
| KR | 20100084935 | * | 7/2010 |
| KR | 20100084935 | A | 7/2010 |
| KR | 20100084935 | A * | 7/2010 |
| KR | 10-0985667 | B1 | 9/2010 |
| KR | 2011-0111018 | A | 10/2011 |
| KR | 2014-0094486 | A | 7/2014 |
| KR | 10-1529515 | B1 | 6/2015 |
| KR | 10-1595956 | B1 | 2/2016 |
| KR | 2016-0072410 | A | 6/2016 |
| KR | 10-1671998 | B1 | 11/2016 |

OTHER PUBLICATIONS

Chinese Search Report for Application No. 2017800565386, dated Oct. 27, 2020, 3 pages.
International Search Report issued in PCT/KR2017/013668, dated Feb. 8, 2018, 2 pages.

* cited by examiner

APPARATUS AND METHOD FOR PROCESSING BATTERY CELL VOLTAGE DATA

CROSS REFERENCE TO RELATED APPLICATIONS

The present application is a national phase entry under 35 U.S.C. § 371 of International Application No. PCT/KR2017/013668 filed Nov. 28, 2017, published in Korean, which claims priority from Korean Patent Application No. 10-2017-0028250 filed in the Korean Intellectual Property Office on Mar. 6, 2017, all of which are incorporated herein by reference.

Technical Field

The present invention relates to an apparatus and a method for processing battery cell voltage data, and more particularly, to an apparatus and a method for processing battery cell voltage data, which calculate a moving average by assigning a weight to one or more voltage data acquired from the battery cell and reflect the acquired voltage data to the calculated moving average and use the voltage data to rapidly follow a sudden change of the voltage data applied from the battery cell.

Background Art

A secondary battery having electric characteristics, such as high ease of applicability according to a product group and high energy density, has been commonly applied to electric vehicles (EV), hybrid vehicles (HV), energy storage systems, or the like which are driven by an electric driving source, as well as portable devices.

The secondary battery has received public attention as a new energy source for promoting eco-friendly performance and energy efficiency in that byproducts are not generated at all according to the use of the secondary battery as well as a primary advantage of dramatically reducing the use of fossil fuels.

Meanwhile, the secondary battery applied to the electric vehicle or the like is applied to the electric vehicle, or the like in a structure of a battery pack constructed by connecting a battery module including a plurality of battery cells in series in order to obtain a high output. In addition to such a basic structure, the secondary battery may be configured to additionally include a battery management system (BMS) for monitoring and controlling states of the respective battery cells and battery packs by applying an algorithm for power supply control and charge/discharge control to a drive load such as a motor, or the like.

Herein, the BMS generally detects and controls a charge state, a capacity deterioration state, and output voltage of the battery cell by periodically measuring the voltage of the battery cell when charging/discharging the battery cell and the battery pack including the same to protect the battery pack from an abnormal situation such as overcharging or overdischarging.

Meanwhile, in the BMS in the related art, since a plurality of voltage data periodically measured from a battery is just measured or arithmetically averaged and measured, the measured voltage data is varied sensitively to minute external noise, and as a result, an error frequently occurs in measuring the voltage data.

Accordingly, in recent years, the voltage data of the battery cell is measured in the BMS, and the obtained voltage data is reflected to the moving average of one or more voltage data to be measured, thereby reducing the error in measuring the voltage data due to external noise.

However, although the voltage data measurement method using the moving average can prevent the measurement error of the voltage data of the BMS due to the external noise, there is a limit that it is difficult to follow the sudden variation of the voltage data due to charging/discharging of the battery cell and the battery pack including the same.

DETAILED DESCRIPTION OF THE INVENTION

Technical Problem

An object of the present invention is to provide an apparatus and a method for processing battery cell voltage data, which calculate a moving average by assigning a weight to one or more voltage data acquired from the battery cell and reflect the acquired voltage data to the calculated moving average and use the voltage data reflected to the moving average to rapidly follow a sudden change of the voltage data applied from the battery cell.

Further, an object of the present invention is to provide an apparatus and a method for processing battery cell voltage data, which continuously assign a weight to one or more voltage data obtained from the battery cell and use the voltage data to continuously detect sudden variation of the voltage data.

Technical Solution

According to an embodiment of the present invention, an apparatus for processing battery cell voltage data may include: a voltage data acquiring unit configured to acquire voltage data by measuring voltage applied from one or more battery cells; a weight processing unit configured to calculate weights corresponding to one or more of the acquired voltage data and to assign the calculated weights to the respective voltage data; a moving average calculating unit configured to calculate a moving average of the one or more voltage data to which the weights are assigned; and a voltage data processing unit configured to acquire current voltage data by reflecting previously acquired voltage data to the moving average.

In the embodiment, the weight processing unit may be configured to select any one or more of the acquired voltage data and to calculate the weight corresponding to the selected voltage data based on a count of the selected voltage data.

In the embodiment, the weight processing unit may be configured to calculate and to assign a largest weight for the voltage data corresponding to a currently measured voltage value.

In the embodiment, the voltage data processing unit may be configured to acquire the current voltage data by using $$\frac{W_0 C_0 + W_1 C_1 + o + W_n C_n}{W_0 + W_1 + o + W_n}$$

wherein, c0, c1, and cn are the voltage data acquired initially, at a 1-st step, and an n-th step, respectively and w0, w1, and wn are the weights calculated initially, at the 1-st step, and the n-th step, respectively.

Further, according to another embodiment of the present invention, a method for processing battery cell voltage data may include: acquiring voltage data by measuring voltage applied from one or more battery cells; calculating weights corresponding to one or more of the acquired voltage data and assigning the calculated weights to the respective voltage data; calculating a moving average of the one or more voltage data to which the weights are assigned; and acquiring current voltage data by reflecting previously acquired voltage data to the moving average.

In the embodiment, the calculating of the weights and assigning of the calculated weights to the respective voltage data may further include selecting any one or more of the acquired voltage data, and calculating the weight corresponding to the selected voltage data based on a count of the selected voltage data.

In the embodiment, the calculating of the weights and assigning of the calculated weights to the voltage data may further include calculating and assigning a largest weight for the voltage data corresponding to a currently measured voltage value.

In the embodiment, in the acquiring of the voltage data at the current step, the current voltage data may be acquired by using $$\frac{W_0 C_0 + W_1 C_1 + o + W_n C_n}{W_0 + W_1 + o + W_n}$$

wherein, c0, c1, and cn are the voltage data acquired initially, at a 1-st step, and an n-th step, respectively and w0, w1, and wn are the weights calculated initially, at the 1-st step, and the n-th step, respectively.

Advantageous Effects

According to an aspect of the present invention, provided are an apparatus and a method for processing battery cell voltage data, which calculate a moving average by assigning a weight to one or more voltage data acquired from the battery cell and reflect the acquired voltage data to the calculated moving average and use the voltage data to rapidly follow a sudden change of the voltage data applied from the battery cell.

Further, according to another aspect of the present invention, provided are an apparatus and a method for processing battery cell voltage data, which continuously assign a weight to one or more voltage data obtained from the battery cell and reflect the voltage data to the moving average and use the reflected voltage data to continuously detect sudden variation of the voltage data.

BEST MODE

Figure 1:
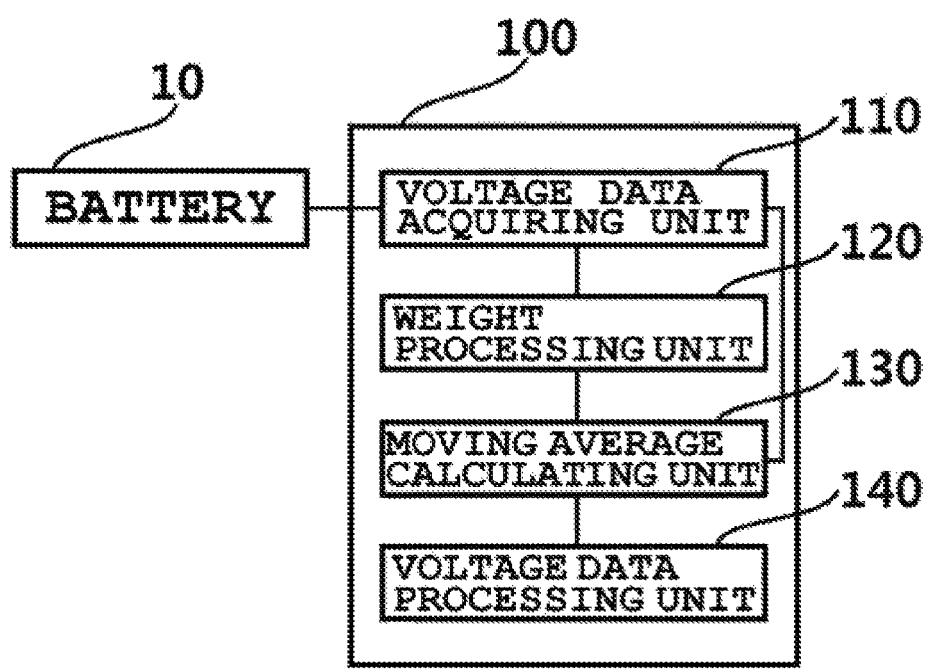
FIG. 1 is a diagram schematically illustrating a configuration of an apparatus for processing battery cell voltage data according to an embodiment of the present invention.

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

Further, an "abnormal situation" described in the specification may mean a malfunction occurrence situation of a battery 10 and an apparatus including the battery 10 due to overcurrent, overvoltage, and overheating of the battery 10.

FIG. 1 is a diagram schematically illustrating a configuration of an apparatus 100 for processing battery cell voltage data according to an embodiment of the present invention.

However, the apparatus 100 for processing battery cell voltage data illustrated in FIG. 1 follows the embodiment and it should be noted that constituent elements thereof are not limited to the embodiment illustrated in FIG. 1 and as necessary, some constituent elements may be added, modified, or deleted.

Further, it is noted that the apparatus 100 for processing battery cell voltage data illustrated in FIG. 1 may be applied to all technical fields to which a secondary battery may be applied.

First, referring to FIG. 1, the apparatus 100 for processing battery cell voltage data according to the embodiment of the present invention may be configured to include a voltage data acquiring unit 110, a weight processing unit 120, a moving average calculating unit 130, and a voltage data processing unit 140.

Herein, the battery cell voltage data processing apparatus 100 may be used as a battery monitoring integrated circuit (BMIC) for measuring voltage data from one or more batteries in a battery management system (BMS), but is not limited thereto.

First, the voltage data acquiring unit 110 may serve to measure voltage applied from a battery 10 including a battery pack constituted by a battery cell or one or more battery cells to acquire the voltage data.

Herein, a type of battery 10 is not particularly limited and the battery 10 may be implemented by, batteries including, for example, a lithium ion battery, a lithium polymer battery, a nickel cadmium battery, a nickel hydrogen battery, a nickel zinc battery, and the like.

Meanwhile, a value of the voltage data may vary due to external noise of the battery cell voltage data processing apparatus 100 or charge/discharge of the battery 10.

Next, the weight processing unit 120 may serve to calculate a weight corresponding to each of one or more voltage data acquired through the voltage data acquiring unit 110 and assign the weight to the corresponding voltage data.

Herein, the weight may be calculated based on the number of one or more voltage data acquired through the voltage data acquiring unit 110.

For example, when the voltage data of the voltage data acquiring unit 110 acquires n-th (herein, n means a positive integer) voltage data from the voltage data acquiring unit 110, the weight processing unit 120 may assign a weight weighted at n times to the voltage data acquired at an n-th time.

That is, the weight processing unit 120 calculates and assigns the weight based on the number of acquired voltage data to calculate and assign the largest weight for the voltage data corresponding to a voltage value of the battery 10, which is measured at a current step.

However, a weight calculation method of the weight processing unit 120 according to the embodiment is not limited to the above-described method and it is noted that the method of calculating the weight may be changed according to setting by a user.

As an example, when a weight weighted by a predetermined value is configured to be assigned to each of the voltage data acquired by the user, the weight processing unit 120 may assign the weight weighted by the predetermined value to the voltage data acquired at the n-th time.

Next, the moving average calculating unit 130 may serve to calculate a moving average of one or more voltage data to which the weight is assigned.

Herein, the moving average may be calculated through $$\frac{W_0 C_0 + W_1 C_1 + o + W_n C_n}{W_0 + W_1 + o + W_n}$$

(herein, c0, c1, and cn are the voltage data acquired first, at a 1-st step, and an n-th step, respectively and w0, w1, and wn are the weights calculated first, at the 1-st step, and the n-th step, respectively).

However, the method of calculating the moving average according to an embodiment is not limited to the above-described method and it is noted that any method may be used as long as the corresponding method may acquire the moving average of one or more voltage data to which the weights are assigned.

Next, the voltage data processing unit 140 may serve to reflect the voltage data of the battery 10 acquired through the voltage data acquiring unit 110 to the moving average to acquire the voltage data used at the current step.

Herein, the voltage data used at the current step may be voltage data of the battery 10, which is actually measured when the voltage data of the battery 10 is measured in the battery cell voltage data processing apparatus 100 and the battery management apparatus (e.g., BMS) having the battery cell voltage data processing apparatus 100.

Meanwhile, since the value of the voltage data used at the current step is a value obtained by reflecting one or more voltage data acquired through the voltage data acquiring unit 110 to the moving average, the value of the voltage data may be equal to a moving average value of one or more voltage data acquired up to now.

That is, the voltage data acquired at the n-th time from the voltage data acquiring unit 110 is reflected to an equation of the moving average by the voltage data processing unit 140 and acquired and used as the voltage data used at the current step, and as a result, a voltage difference and a voltage variation value between one or more voltage data may be gentle during measuring the voltage data of the battery 10.

Further, the voltage data to be acquired is reflected to the moving average to acquire the voltage data to be used at the current step and the voltage data used at the current step is acquired through the moving average of one or more voltage data assigned with the weight based on the number of acquired voltage data to rapidly follow the voltage data which abruptly varies due to the charge/discharge of the battery 10.

Figure 2:
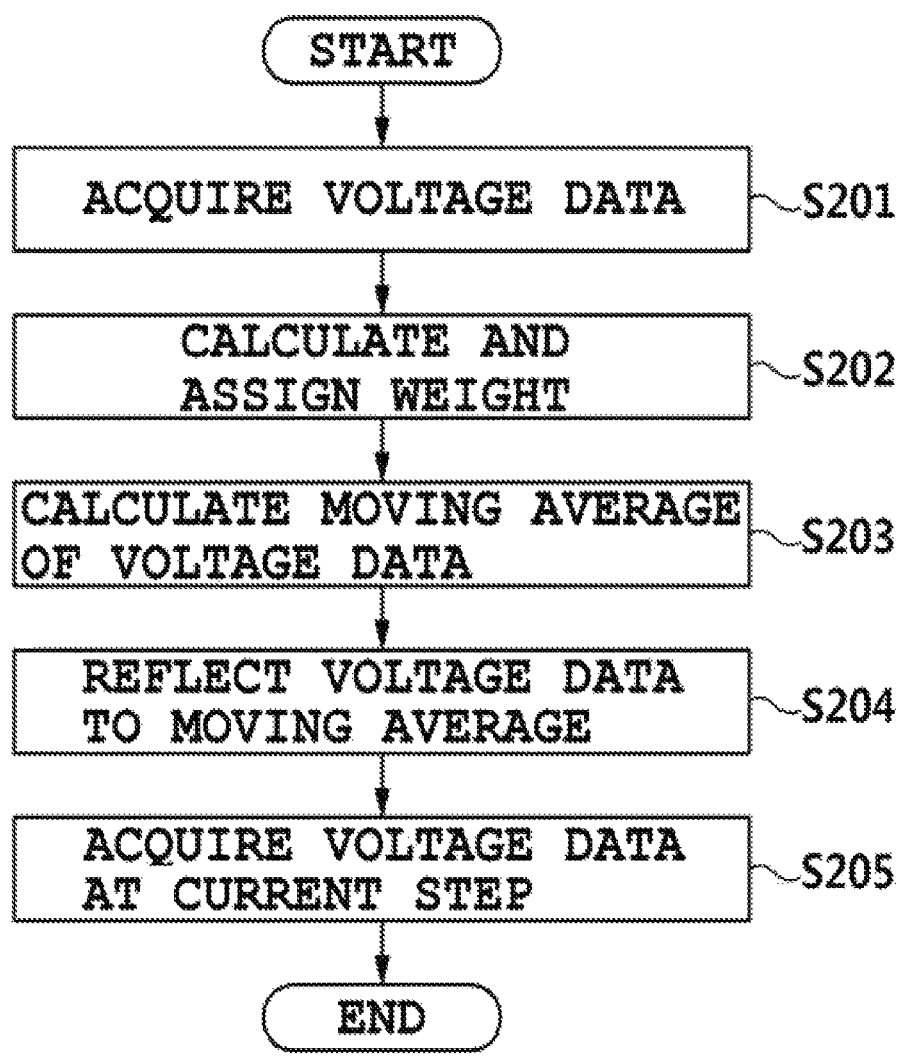
FIG. 2 is a flowchart for describing a process of a method for processing battery cell voltage data according to an embodiment of the present invention.

Next, FIG. 2 is a diagram schematically illustrating a process of a method for processing battery cell voltage data according to an embodiment of the present invention.

However, the method for processing battery cell voltage data illustrated in FIG. 2 follows the embodiment and it should be noted that the process thereof is not limited to the embodiment illustrated in FIG. 2 and as necessary, some processes may be added, modified, or deleted.

A battery cell voltage data processing process of the method for processing battery cell voltage data according to the embodiment of the present invention is schematically described with reference to FIG. 2. First, when the voltage data acquiring unit 110 acquires the voltage data by measuring the voltage applied from the battery 10 including the battery cell or the battery pack constituted by one or more battery cells (S201), the weight processing unit 120 calculates the weight corresponding to the acquired voltage data and assigns the calculated weight to each of the voltage data (S202).

Herein, the weight processing unit 120 calculates and assigns the weight corresponding to the voltage data based on the number of one or more acquired voltage data to calculate and assign the largest weight for the voltage data corresponding to the voltage of the battery 10, which is measured at the current step.

Next, the moving average calculating unit 130 calculates the moving average of one or more voltage data to which the weight is assigned (S203).

Herein, the moving average calculating unit 130 may calculate the moving average of the voltage data through $$\frac{W_0 C_0 + W_1 C_1 + o + W_n C_n}{W_0 + W_1 + o + W_n}$$

(herein, c0, c1, and cn are the voltage data acquired first, at a 1-st step, and an n-th step, respectively and w0, w1, and wn are the weights calculated first, at the 1-st step, and the n-th step, respectively).

Next, the voltage data processing unit 140 reflects the voltage data acquired from the voltage data acquiring unit 110 to the moving average calculated from the moving average calculating unit 130 (S204) to acquire the voltage data used at the current step (S205).

Herein, the voltage data used at the current step may be voltage data, which is actually measured to detect a charging state, a capacity deterioration state, and an output voltage state of the battery 10 in the battery cell voltage data processing apparatus 100 and the battery management apparatus (e.g., BMS) having the battery cell voltage data processing apparatus 100.

That is, the weight is assigned to the voltage data acquired through the voltage data acquiring unit 110 based on the number of acquired voltage data and the voltage data is reflected to the calculated moving average to be acquired as the actual voltage data used at the current step to rapidly follow the fluctuation of the voltage data due to a voltage fluctuation situation such as the charge/discharge of the battery 10.

In addition, the weight is continuously assigned to one or more acquired voltage data and the voltage data is reflected to the moving average to be used, thereby continuously detecting the voltage data fluctuation of the battery 10.

Hereinabove, a specific embodiment of the present invention has been illustrated and described, but the technical spirit of the present invention is not limited to the accompanying drawings and the described contents and it is apparent to those skilled in the art that various modifications of the present invention can be made within the scope without departing from the technical spirit of the present invention and it will be regarded that the modifications are included in the claims of the present invention without departing from the spirit of the present invention.

The invention claimed is:

1. An apparatus for processing electric vehicle battery cell voltage data, the apparatus comprising:
   a voltage data acquiring unit configured to acquire three or more voltage data measurements of a voltage applied from one or more battery cells of an electric vehicle;
   a weight processing unit configured to calculate three or more weighting values and to assign the calculated three or more weighting values to the three or more voltage data measurements in a one-to-one correspondence;
   a moving average calculating unit configured to calculate a moving average of the three or more voltage data measurements using a formula that receives each of the three or more voltage data measurement and the corresponding three or more weighting values as input and outputs the moving average, wherein the moving average is indicative of the voltage applied from the one or more battery cells; and
   a voltage data processing unit configured to:
      detect a change in voltage applied from the battery cell based on the calculated moving average; and
      control a state of the one or more battery cells based on the detected change in voltage,
   wherein the three or more weighting values are calculated and assigned such that charging and discharging of the one or more battery cells of the electric vehicle is detected by the voltage data processing unit and external noise from the electric vehicle is not detected by the voltage data processing unit.

2. The apparatus of claim 1, wherein the weight processing unit is configured to calculate the plurality of weighting values based on a quantity of voltage data measurements determined to have been acquired by the voltage data acquiring unit.

3. The apparatus of claim 1, wherein the weight processing unit is configured to assign a largest weighting value to a most-recently measured voltage value.

4. The apparatus of claim 1, wherein the formula is:

$$\frac{W_0 C_0 + W_1 C_1 + \ldots + W_n C_n}{W_0 + W_1 + \ldots + W_n}$$

wherein, $C_0$, $C_1$ and $C_n$ are voltage data measurements acquired at times 0, 1 and n, respectively and wherein $W_0$, $W_1$ and $W_n$ are weighting values corresponding to $C_0$, $C_1$ and $C_n$, respectively.

5. The apparatus of claim 2, wherein, for an $n^{th}$ voltage data measurement acquired by the voltage data acquiring unit, the weight processing unit is configured to assign a weighting value equal to n.

6. The apparatus of claim 5, wherein the weighting value equal to n is greater than the weighting values assigned to all voltage data measurements acquired prior to the $n^{th}$ voltage data measurement.

7. The apparatus of claim 1, wherein the state of the one or more battery cells controlled by the voltage data processing unit includes at least one of: a charge state; a capacity deterioration state; or an output voltage of the one or more battery cells.

8. The apparatus of claim 1, wherein the voltage data processing unit is configured to detect an abnormal situation based on the change in voltage and control the state of the one or more battery cells in response to detection of the abnormal situation, wherein the abnormal situation includes one of overcharging the one or more battery cells, overdischarging the one or more battery cells, overcurrent of the one or more battery cells, overvoltage of the one or more battery cells, or overheating of the one or more battery cells.

9. A method for processing battery cell voltage data, the method comprising:
   acquiring three or more voltage data measurements of a voltage applied from one or more battery cells;
   calculating three or more weighting values;
   assigning the three or more calculated weighting values to the three or more voltage data measurements in a one-to-one correspondence;
   calculating a moving average of the voltage data measurements using a formula that receives each of the three or more voltage data measurement and the corresponding three or more weighting values as input and outputs the moving average, wherein the moving average is indicative of the voltage applied from the one or more battery cells;
   detecting a change in voltage applied from the battery cell based on the calculated moving average; and
   controlling a state of the one or more battery cells based on the detected change in voltage,
   wherein the three or more weighting values are calculated and assigned such that charging and discharging of the one or more battery cells of the electric vehicle is detected by the voltage data processing unit and external noise from the electric vehicle is not detected by the voltage data processing unit.

10. The method of claim 9, further comprising determining a quantity of voltage data measurements, wherein calculating the weighting values is based on the determined quantity of voltage data measurements acquired by the voltage data acquiring unit.

11. The method of claim 9, wherein assigning the calculated weighting values comprises assigning a largest weighting value to a most-recently measured voltage value.

12. The method of claim 9, wherein the formula is:

$$\frac{W_0 C_0 + W_1 C_1 + \ldots + W_n C_n}{W_0 + W_1 + \ldots + W_n}$$

wherein, $C_0$, $C_1$ and $C_n$ are voltage data measurements acquired at times 0, 1 and n, respectively and wherein $W_0$, $W_1$ and Wn are weighting values corresponding to $C_0$, $C_1$ and $C_n$, respectively.

13. The method of claim 10, wherein assigning the calculated weighting values comprises assigning to an $n^{th}$ voltage data measurement acquired by the voltage data acquiring unit a weighting value equal to n.

14. The method of claim 13, wherein the weighting value equal to n is greater than the weighting values assigned to all voltage data measurements acquired prior to the $n^{th}$ voltage data measurement.

15. The method of claim 9, wherein the state of the one or more battery cells controlled based on the detected change in voltage includes at least one of: a charge state; a capacity deterioration state; or an output voltage of the one or more battery cells.

16. The method of claim 9, further comprising detecting an abnormal situation based on the change in voltage, wherein controlling the state of the one or more battery cells is in response to detection of the abnormal situation, and wherein the abnormal situation includes one of overcharging the one or more battery cells, overdischarging the one or more battery cells, overcurrent of the one or more battery cells, overvoltage of the one or more battery cells, or overheating of the one or more battery cells.

* * * * *